(12) United States Patent
Arghavani et al.

(10) Patent No.: US 6,221,789 B1
(45) Date of Patent: *Apr. 24, 2001

(54) THIN OXIDES OF SILICON

(75) Inventors: Reza Arghavani, Aloha; Robert S. Chau, Beaverton, both of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/124,562

(22) Filed: Jul. 29, 1998

(51) Int. Cl.$^7$ .................................................. H01L 21/469
(52) U.S. Cl. ............................ 438/763; 438/770; 438/779
(58) Field of Search .................................... 438/763, 770, 438/305; 437/70, 228, 293, 239

(56) References Cited

U.S. PATENT DOCUMENTS

| | | | |
|---|---|---|---|
| 4,401,691 | * 8/1983 | Young | 427/93 |
| 5,244,843 | * 9/1993 | Chau et al. | 437/239 |
| 5,498,577 | * 3/1996 | Fulford, Jr. et al. | 437/228 |
| 5,580,816 | * 12/1996 | Hemmenway et al. | 437/70 |
| 5,851,892 | * 12/1998 | Lojek et al. | 438/305 |
| 5,891,809 | * 4/1999 | Chau et al. | 438/770 |
| 5,902,452 | * 5/1999 | Cheng et al. | 156/657 |

* cited by examiner

Primary Examiner—David Nelms
Assistant Examiner—Phuc T. Dang
(74) Attorney, Agent, or Firm—Blakely, Sokoloff, Taylor & Zafman LLP

(57) ABSTRACT

An oxidation process that produces multi-layer, yet very thin oxides of silicon, formed on silicon substrates, includes pushing wafers at a particular range of speeds, into a furnace at a particular range of temperatures, sequentially oxidizing the wafers in varying chemical ambients, and operating an external chlorine compound generator coupled to the furnace. Oxides formed in this manner have good uniformity and low interface state density and are suitable for forming FETs.

In a particular embodiment, a first portion of an oxide stack is formed in an oxygen/nitrogen ambient, a second portion of an oxide stack is formed in a carbon dioxide/hydrogen chloride/oxygen ambient, and a third portion of an oxide stack is formed by a wet oxidation. The second portion of the oxide stack is formed when 1,2-dichloroethylene is treated with heat and oxygen to produce carbon dioxide and hydrogen chloride gas that is then introduced into the furnace.

16 Claims, 3 Drawing Sheets

THIN OXIDES OF SILICON

BACKGROUND OF THE INVENTION

1. Field of the Invention

The present invention relates generally to formation of oxides of silicon, and more particularly to the formation of thin oxides for use in microelectronic devices.

2. Background

Advances in semiconductor manufacturing technology have led to the integration of millions of circuit elements, such as transistors, on a single integrated circuit (IC). Not only have interconnect line widths become smaller, but so have the dimensions of metal-oxide-semiconductor field effect transistors (MOSFETs). MOSFETs are also commonly referred to simply as FETs.

It has been known that in order to manufacture smaller and smaller FETs with desirable electrical characteristics, the effective thickness of the gate insulator layer had to be scaled along with the linear dimensions of these FETs. As the linear dimensions of FETs have scaled down into the deep submicron region, the requirement of forming the correspondingly extremely thin gate insulator layers has become a major challenge for semiconductor manufacturers.

Electrical, mechanical and manufacturing requirements for gate insulating layers include, but are not limited to, low density of interface states, low defect density, and good uniformity.

What is needed is a method of forming ultra thin oxide layers on silicon substrates, while simultaneously achieving a low density of interface states.

SUMMARY OF THE INVENTION

Briefly, a dry/wet oxidation process that produces very thin oxides of silicon, formed on silicon substrates, includes pushing wafers at a particular range of speeds, into a furnace at a particular range of temperatures, sequentially oxidizing the wafers in varying chemical ambients, and operating an external chlorine compound generator coupled to the furnace.

In a particular embodiment, a first portion of an oxide stack is formed in an oxygen/nitrogen ambient, a second portion of an oxide stack is formed in a carbon dioxide/hydrogen chloride/oxygen ambient, and a third portion of an oxide stack is formed by a wet oxidation. The second portion of the oxide stack is formed in the presence of a chlorine compound when 1,2-dichloroethylene is treated with heat and oxygen to produce carbon dioxide and hydrogen chloride gas that is then introduced into the furnace.

DETAILED DESCRIPTION

Terminology

Figure 1:
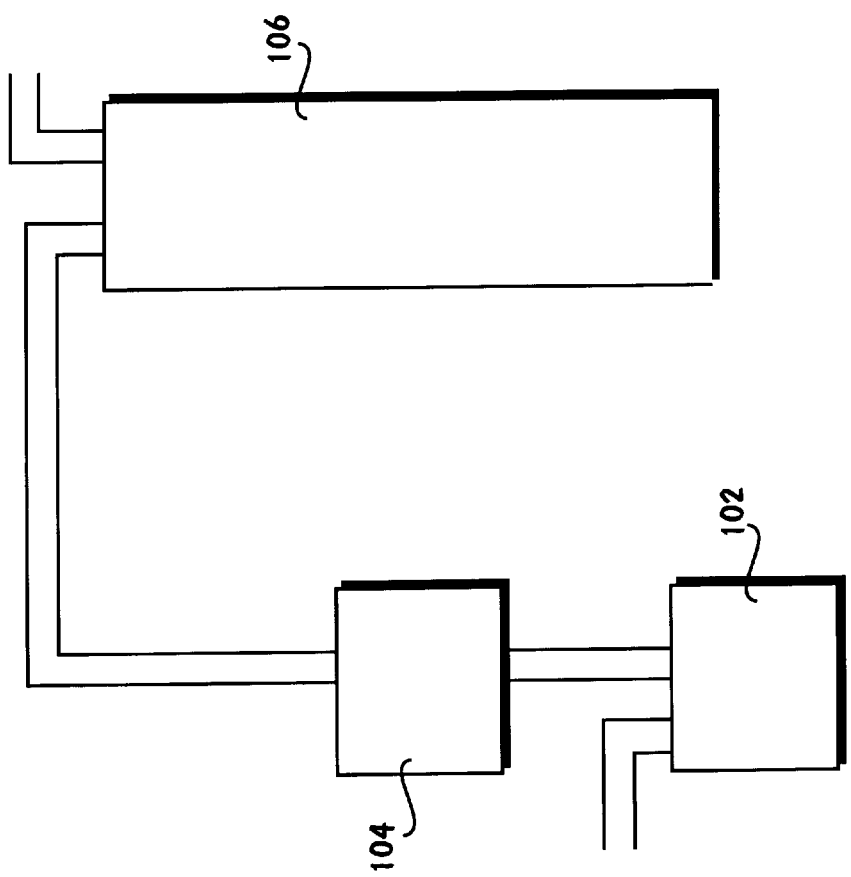
FIG. 1 is a schematic diagram showing a vertical diffusion furnace and a reactor external to the vertical diffusion furnace.

The terms, chip, integrated circuit, monolithic device, semiconductor device, and microelectronic device, are often used interchangeably in this field. The present invention is applicable to all the above as they are generally understood in the field.

Dichloroethylene is also referred to as DCE.

Vertical diffusion furnace (VDF) refers to a furnace, generally fashioned from quartz, that is vertically oriented when installed in a manufacturing environment. High temperature operations other than diffusion processes, for example, oxidation processes, can be performed in a VDF.

Historically, the material most commonly used in the semiconductor industry to form the gate insulator layer of a FET is silicon dioxide. Thus the gate insulator layer is frequently referred to simply as the gate oxide.

Overview

Some semiconductor manufacturing processes include a dry/wet oxidation sequence to form the gate oxide. Gate oxide thicknesses for MOSFETs with channel lengths of approximately 0.35 microns are typically in the range of 5.3 nm to 6.3 nm. Gate oxide thicknesses for MOSFETs with channel lengths of approximately 0.25 microns are typically about 3.2 nm. In the case of MOSFETs having 0.18 micron channel lengths, the gate oxide thickness is about 2 nm.

When these gate oxides, such as those described above, are formed, an oxidation operation is performed at temperatures approximately equal to or greater than 700° C. These gate oxidation operations generally proceed in three steps. First wafers are pushed into a furnace having an oxygen-nitrogen ambient. The oxygen-nitrogen ambient substantially eliminates nitrogen pitting of the wafers. The oxide that forms during this wafer push operation is referred to as "push oxide". The push oxide is a dry oxide, which is beneficial to the quality of the final gate oxide stack since it prevents direct chlorination of the silicon surface during a subsequent processing operation. Second, a chlorinated hydrocarbon such as 1,2 dichloroethylene (DCE) is introduced into the furnace, along with oxygen, where it reacts to facilitate the formation of additional oxide. This additional oxide is grown immediately after the push oxide and moves the push oxide one stack level higher. Subsequently, a wet oxidation moves the previous two oxidation layers one stack level higher, and thus forms the final $Si/SiO_2$ interface.

Using wet oxidation for the final oxide growth operation results in a lower density of interface states than would be achieved with an oxygen only oxidation. Similarly, wet oxidation results in a lower density of interface states than would result from a simple chlorinated oxide process. Additionally, the dry and wet oxidation operations, in accordance with the present invention, produce a very thin oxide layer with a desirably low density of defects.

However, dry/wet process flows such as those described above have been unable to produce thin oxides of approximately 1.0 nm and thinner.

By using a unique combination of external DCE combustion, and temperature, push speed, and flow rate ranges, a dry/wet oxidation process in accordance with the present invention delivers reasonable uniformity of thickness, low defect density, and low interface state density for oxides of less than approximately 1 nm.

FIG. 1 shows a simplified block diagram of processing equipment coupled to practice the present invention. More particularly, a bubbler 102 is coupled to a reactor 104 which in turn is coupled to a vertical diffusion furnace 106. Bubbler 102 is configured to receive a carrier gas and to pass the carrier gas along with vapor from the bubbler to reactor 104. Reactor 104 is configured as a combustion chamber, and may receive the contents of bubbler 104 as well as other materials which may be reacted within reactor 104. Furnace 106 is configured to receive reaction products reactor 104 as well as other materials.

Illustrative Process Flow

Figure 2:
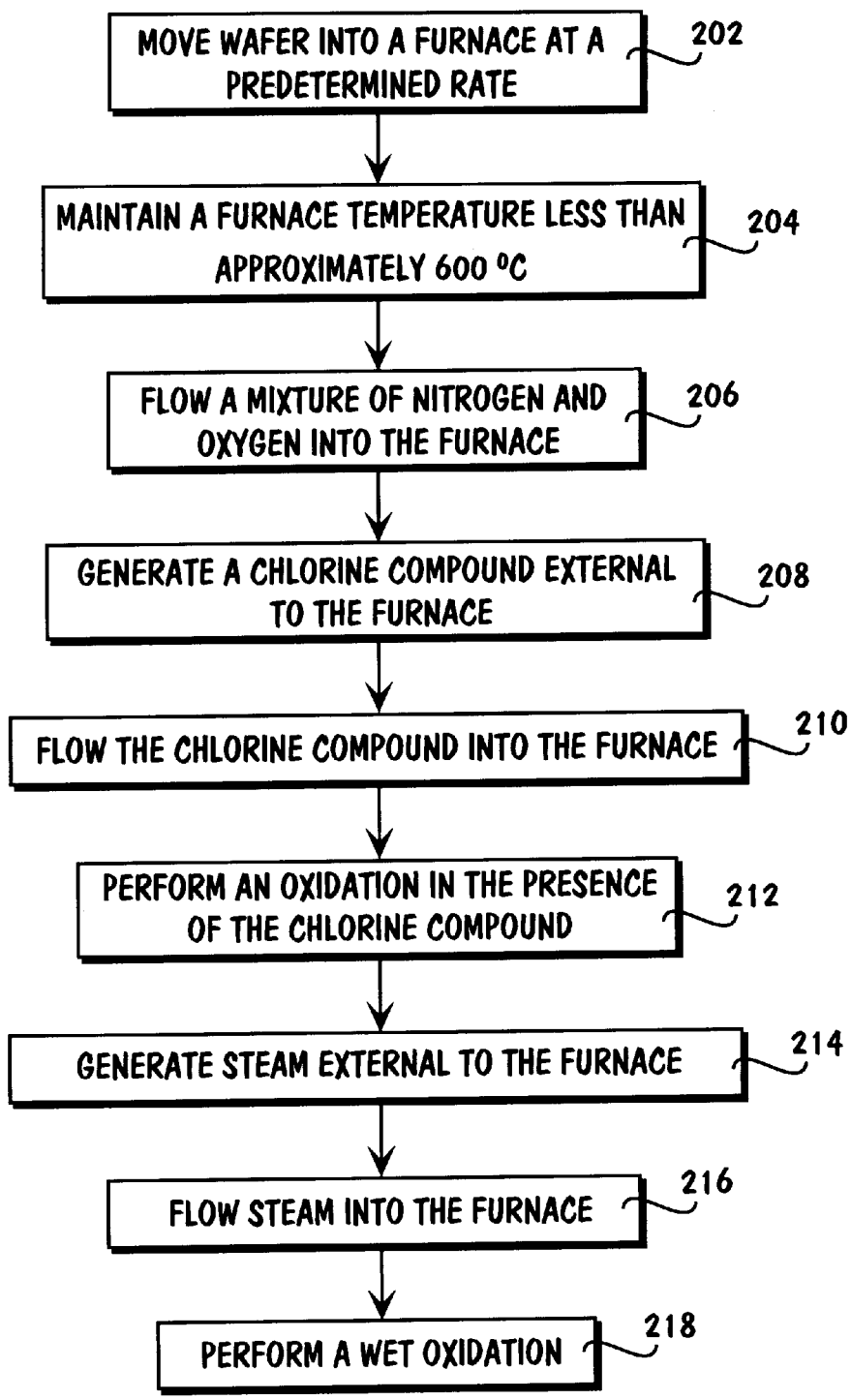
FIG. 2 is a flow diagram of an embodiment of the present invention.
Figure 3:
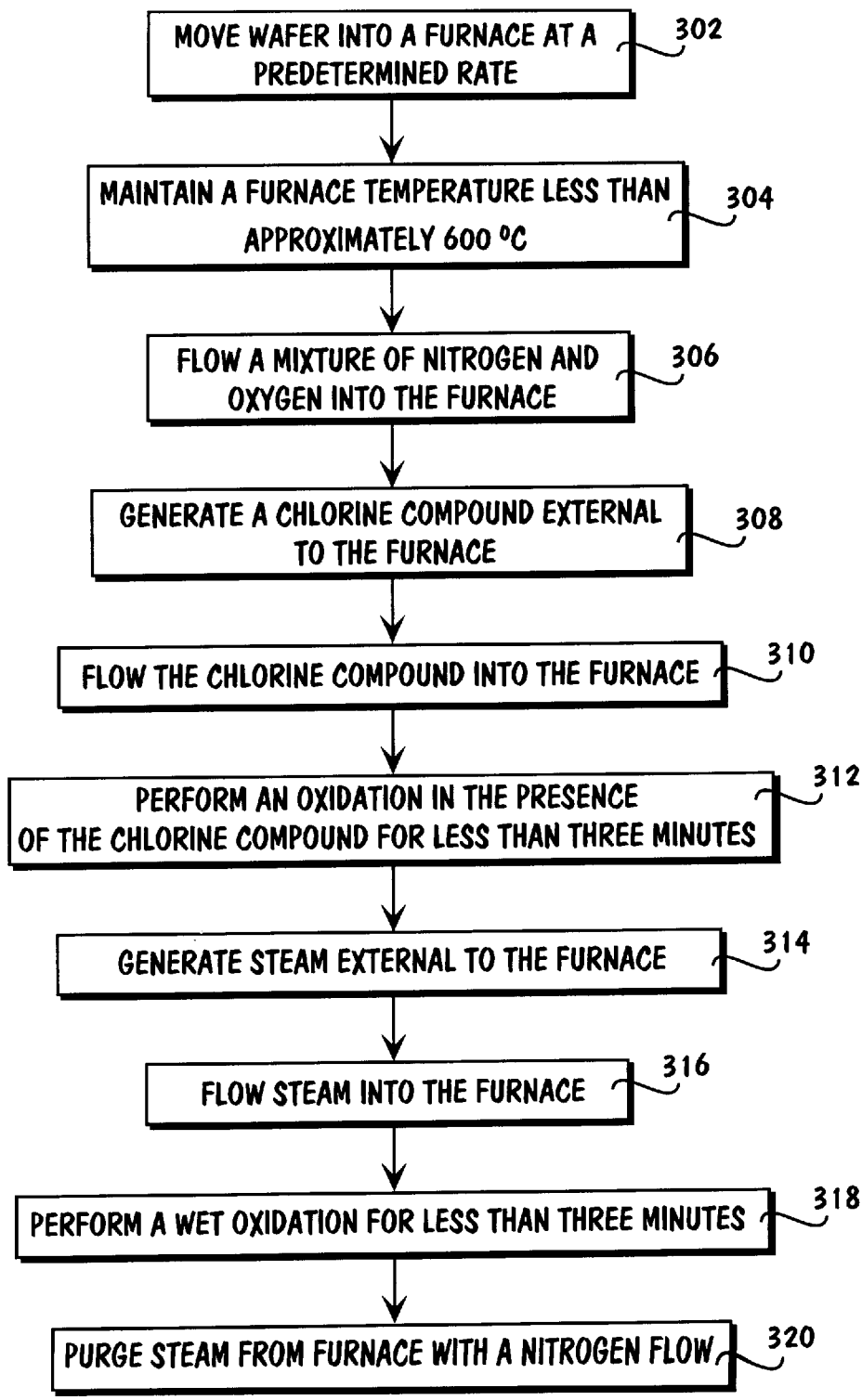
FIG. 3 is a flow diagram of an alternative embodiment of the present invention.

Illustrative embodiments of the present invention are described with reference to FIGS. 2–3. To form an oxide layer in accordance with the present invention, one or more wafers having at least one surface comprised substantially of silicon are moved (202) into a furnace at a temperature of approximately 400 to 600° C. (204). A temperature of approximately 500° C. is used in the illustrative embodiment. The furnace is typically a vertical diffusion furnace and the wafers are typically pushed into the furnace at approximately 100 to 600 mm per minute. A push rate of approximately 500 mm per minute is used in the illustrative embodiment. While the wafers are pushed into the furnace, nitrogen, $N_2$, and oxygen, $O_2$, flow (206) into the VDF, typically from the top of the VDF through a shower head arrangement. In the illustrative embodiment, the flow conditions are approximately 9.9 slpm $N_2$, and 0.1 slpm $O_2$. Although the VDF temperature in the illustrative embodiment is approximately 500° C., a furnace temperature in the range of 400 to 600° C. may be used. An initial amount of oxidation of the wafers in this $N_2/O_2$ environment takes place. As a result of the temperature, push rate and flow conditions only a few angstroms of oxide are grown.

After the wafers have come to a stop in the VDF, HCl and $CO_2$ flow into the VDF (210) and a chlorinated oxidation (212) takes place in the presence of HCl and oxygen at a temperature in the range of approximately 400 to 600° C. In the illustrative embodiment, a furnace temperature of approximately 500° C. is used for the chlorinated oxidation operation.

The HCl and $CO_2$ that flow into the VDF come from a reactor that is external to the VDF. The reactor is coupled to the VDF. A bubbler, also referred to herein as the DCE bath, is coupled to the reactor. The DCE bath is maintained at approximately 18 to 20° C. Nitrogen is introduced into the DCE bath as a carrier gas. The nitrogen flow rate is in the range of approximately 0.1 slpm to 1 slpm. DCE is carried out of the bubbler, i.e., the DCE bath, and into the reactor by the nitrogen carrier gas in the form of a vapor.

In the reactor, the $DCE/N_2$ vapor/gas mixture is heated to a temperature in the range of 800 to 900° C., in the presence of oxygen, to form HCl (208) and $CO_2$. The DCE and oxygen react according to the following equation:

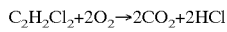

$$C_2H_2Cl_2 + 2O_2 \rightarrow 2CO_2 + 2HCl$$

The reactor may also be referred to as a combustion chamber. The oxygen flow rate into the reactor is in the range of approximately 1 slpm to 10 slpm. To reduce the risk of fire or explosion, the ratio of $O_2$ to DCE should be greater than approximately 8 to 1. Hydrocarbons are not intentionally introduced into the VDF. Uniformity control for the chlorinated oxidation operation is facilitated by limiting the nitrogen flow rate through the DCE bath to the range described above. Once the HCl is formed, it then flows along with the excess (i.e., the un-reacted) oxygen into the furnace where the chlorinated oxidation (212) will take place at 400–600° C., as described above.

After the oxidation in the presence of chlorine described above, a wet oxidation operation (218) is performed on the wafers in the VDF. Hydrogen and oxygen are reacted to form steam. More particularly, the steam is formed (214) by mixing, at a temperature of 800 to 900° C., oxygen at approximately 5 slpm with hydrogen at approximately 2 slpm in a combustion chamber external to the VDF. The combustion chamber can be the same external chamber where DCE and oxygen were combusted to form HCl and $CO_2$. To reduce the risk of explosion the ratio Of $O_2$ to $H_2$ should be greater than 2 to 1. The oxygen flow rate can be in the range of approximately 1 to 5 slpm, and the hydrogen flow rate can be in the range of approximately 0.1 to 3 slpm, as long as the ratio relationship of oxygen to hydrogen is maintained as described above.

The steam generated in the external combustion chamber is then directed into the VDF (216) where wet oxidation takes place at a temperature in the range of approximately 400 to 600° C. In the illustrative embodiment of the present invention, a temperature of approximately 500° C. is used. The excess steam is scrubbed from the bottom of the VDF.

Of the three oxidation operations described above, i.e., $N_2/O_2$, $CO_2/HCl/O_2$, and wet oxidation, only the $CO_2/HCl/O_2$, and wet oxidation operations are carefully timed. For an oxide layer less than 1 nm, these two oxidation operations are both less than approximately 3 minutes (312, 318).

Typically, after the wet oxidation operation, but before the wafers are unloaded from the VDF, substantially pure nitrogen is flowed into the VDF at approximately 10 slpm in order to purge the steam from the VDF (320). This nitrogen purge operation is not required to form the thin oxide layers in accordance with the present invention.

Those skilled in the art and having the benefit of this disclosure will recognize that subsequent to the oxidation process a FET may be fabricated by forming a gate electrode layer superjacent to the oxide layer. The gate electrode layer is typically formed of polysilicon, although those skilled in the art will recognize that other suitable materials may be used to form a gate electrode. Typically a hardmask layer, such as a silicon nitride layer, is then formed over the gate electrode layer and the hardmask is patterned in a conventional manner to expose portions of the underlying gate electrode layer. The exposed portions of the gate electrode layer are then etched. Once the exposed portions of the gate electrode layer have been etched, corresponding portions of the oxide layer are exposed. These exposed areas of the oxide layer are also removed by etching. A doping operation is performed, typically one or more ion implantation operations as is known in the art, to form the source/drain junctions of a FET.

Conclusion

Embodiments of the present invention provide extremely thin oxide layers, (e.g., 0.5 nm to 1.0 nm) on silicon substrates with good uniformity, low defect density, and low interface state density.

The present invention may be implemented with various changes and substitutions to the illustrated embodiments. For example, the present invention may be implemented with wafers of various thicknesses, diameters, crystal orientations, and resistivities.

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined Claims.

What is claimed is:

1. A method of forming an oxide of silicon, comprising:

moving at least one wafer into a furnace at a predetermined rate;

maintaining a furnace temperature less than approximately 600° C.;

flowing a mixture of nitrogen and oxygen into the furnace;

generating a chlorine compound external to the furnace;

flowing at least the chlorine compound into the furnace;

performing an oxidation in the presence of the chlorine compound;

generating steam external to the furnace;

flowing the steam into the furnace; and performing a wet oxidation wherein moving comprises pushing the at least one wafer at approximately 500 mm per minute.

2. The method of claim 1, wherein pushing stops prior to generating a chlorine compound.

3. The method of claim 1, wherein the furnace is vertically oriented, and configured to accept wafers from a bottom of the furnace, and further configured to accept gases from a top of the furnace.

4. A method of forming an oxide of silicon, comprising:

moving at least one wafer into a furnace at a predetermined rate;

maintaining a furnace temperature less than approximately 600° C.;

flowing a mixture of nitrogen and oxygen into the furnace;

generating a chlorine compound external to the furnace;

flowing at least the chlorine compound into the furnace;

performing an oxidation in the presence of the chlorine compound;

generating steam external to the furnace;

flowing the steam into the furnace; and performing a wet oxidation wherein generating a chlorine compound external to the furnace comprises heating, in a reactor coupled to the furnace, 1,2-dichloroethylene in the presence of oxygen.

5. The method of claim 4, wherein the 1,2-dichloroethylene is heated to a temperature between approximately 800 and 900° C.

6. The method of claim 4, further comprising flowing the 1,2-dichloroethylene into the reactor with a carrier gas having a flow rate between approximately 0.1 slpm and 1.0 slpm.

7. A method of forming an oxide of silicon, comprising:

moving at least one wafer into a furnace at a predetermined rate;

maintaining a furnace temperature less than approximately 600° C.;

flowing a mixture of nitrogen and oxygen into the furnace;

generating a chlorine compound external to the furnace;

flowing at least the chlorine compound into the furnace;

performing an oxidation in the presence of the chlorine compound;

generating steam external to the furnace;

flowing the steam into the furnace; and performing a wet oxidation wherein the steam generation comprises flowing hydrogen and oxygen into a reactor coupled to the furnace and reacting the hydrogen and oxygen to create steam at approximately 800 to 900° C.

8. A method of forming an oxide of silicon, comprising:

moving at least one wafer into a furnace at a predetermined rate;

maintaining a furnace temperature less than approximately 600° C.;

flowing a mixture of nitrogen and oxygen into the furnace;

generating a chlorine compound external to the furnace;

flowing at least the chlorine compound into the furnace;

performing an oxidation in the presence of the chlorine compound;

generating steam external to the furnace;

flowing the steam into the furnace; and performing a wet oxidation wherein generating a chlorine compound external to the furnace comprises heating, in a reactor coupled to the furnace, a chlorinated hydrocarbon in the presence of oxygen.

9. The method of claim 8, wherein both the oxidation in the presence of chlorine, and the wet oxidation are performed at temperatures between 400 and 600° C.

10. The method of claim 9, wherein a total thickness of oxide that is formed is in the range of approximately 0.5 nm to 1.0 nm.

11. A method of forming a FET, comprising:

moving at least one wafer into a furnace at a predetermined rate;

maintaining a furnace temperature less than approximately 600° C.;

flowing a mixture of nitrogen and oxygen into the furnace;

generating a chlorine compound external to the furnace;

flowing at least the chlorine compound into the furnace;

flowing the steam into the furnace;

forming a gate electrode layer;

patterning a gate; and forming source/drain junctions aligned to the gate wherein generating a chlorine compound external to the furnace comprises heating, in a reaction vessel coupled to the furnace, a chlorinated hydrocarbon in the presence of oxygen.

12. The method of claim 11, wherein patterning a gate comprises forming a hardmask layer over the gate electrode layer; patterning the hardmask layer to expose portions of the gate electrode layer; and etching the exposed portions of the gate electrode layer.

13. The method of claim 12, further comprising etching exposed portions of the gate oxide layer.

14. A method of forming a gate insulator layer, comprising:

moving at least one silicon wafer into a vertically oriented furnace at approximately 500 mm per minute;

maintaining a furnace temperature less than approximately 600° C. while the at least one silicon wafer is moved into the furnace;

flowing molecular nitrogen and molecular oxygen into the furnace;

generating, external to the furnace, hydrogen chloride gas and carbon dioxide gas from a chlorinated hydrocarbon;

flowing the hydrogen chloride and carbon dioxide into the furnace;

performing an oxidation in the presence of the hydrogen chloride;

generating, external to the furnace, steam from the combustion of hydrogen and oxygen;

flowing the steam into the furnace; and performing a wet oxidation.

15. The method of claim 14, wherein the oxidation in the presence of hydrogen chloride, and the wet oxidation are performed at temperature within the range of approximately 400 to 600° C.

16. The method of claim 15, wherein a total gate oxide thickness is between 0.5–1.0 nm.

* * * * *